(12) United States Patent
Tolstikhin et al.

(10) Patent No.: US 7,609,919 B2
(45) Date of Patent: Oct. 27, 2009

(54) COUPLING-ENHANCED SURFACE ETCHED GRATINGS

(75) Inventors: Valery Tolstikhin, Ottawa (CA); Kirill Pimenov, Ottawa (CA)

(73) Assignee: Onechip Photonics, Ottawa, Ontario (CA)

( * ) Notice: Subject to any disclaimer, the term of this patent is extended or adjusted under 35 U.S.C. 154(b) by 0 days.

(21) Appl. No.: 11/898,398

(22) Filed: Sep. 12, 2007

(65) Prior Publication Data

US 2008/0069496 A1    Mar. 20, 2008

Related U.S. Application Data

(60) Provisional application No. 60/843,704, filed on Sep. 12, 2006.

(51) Int. Cl.
| | |
|---|---|
| *G02B 6/34* | (2006.01) |
| *G02B 6/00* | (2006.01) |
| *G02B 6/12* | (2006.01) |
| *G02B 6/26* | (2006.01) |
| *G02B 6/10* | (2006.01) |
| *H01S 3/00* | (2006.01) |
| *H01S 5/00* | (2006.01) |
| *H01S 3/08* | (2006.01) |

(52) U.S. Cl. .......................... 385/37; 385/13; 385/14; 385/28; 385/39; 385/50; 385/129; 385/130; 385/131; 385/132; 372/38.01; 372/43.01; 372/45.01; 372/46.01; 372/50.1; 372/50.11; 372/96; 372/102; 372/109

(58) Field of Classification Search .................. 385/12, 385/14, 28, 37, 49, 50, 129–132, 13, 39; 372/38.01, 43.01, 45.01, 46.01, 50.1, 50.11, 372/96, 102, 109
See application file for complete search history.

(56) References Cited

U.S. PATENT DOCUMENTS 7,177,335 B2 * 2/2007 Kamp et al. ............. 372/46.01

FOREIGN PATENT DOCUMENTS

EP            1343232 A1        9/2003

* cited by examiner

*Primary Examiner*—Charlie Peng
*Assistant Examiner*—Hung Lam
(74) *Attorney, Agent, or Firm*—Freedman & Associates

(57) ABSTRACT

The invention describes the method and apparatus for enhancement of coupling efficiency in effective-ridge laterally-coupled surface-etched grating waveguide structures, where a slab waveguide has a sequence of the periodic parallel segmented trenches etched from its top surface, such that the segments of intact material having higher refractive index than that in the surrounding segments of periodic trenches form the effective ridges which confine the optical field in and around these ridges, on one hand, and provide bidirectional coupling for the confined modes experiencing Bragg reflection from the segments of the periodic trenches, on the other. The invention discloses the designs of the multiple effective ridge laterally coupled surface-etched grating waveguide structures, which enhances the coupling efficiency as compared to a conventional single effective ridge grating design because of an intended dilution of the lateral confinement caused by the multiple effective ridges, resulting in an increase of the optical mode's overlap with the surface etched grating formed everywhere outside the effective ridges.

22 Claims, 4 Drawing Sheets

COUPLING-ENHANCED SURFACE ETCHED GRATINGS

FIELD OF THE INVENTION

The invention relates generally to the field of integrated photonics, and more particularly to integrated waveguide devices using waveguide Bragg gratings.

BACKGROUND OF THE INVENTION

Explosive growth of the optical communication traffic in recent years, driven by bandwidth hungry applications and progress in transmission technologies alike, has greatly contributed to ever-increasing demand for higher capacity optical networks offering more flexibility at lower cost. Two different yet complimentary trends are becoming more and more evident in this respect. First, deep penetration of the optical fiber into the access networks and, second, greater demand for capacity, bandwidth provisioning and agility back up into the upper layer networks. Both require massive deployment of the optical gear that drives the traffic along the fiber links, on a scale not seen in earlier generation networks. Specifically, optical transceivers, which receive downstream and send upstream data signals, have to be deployed at every optical line terminal or/and network user interface in the access optical networks, but they also are the key optical components to be installed at every node of opaque (local or metropolitan area) optical networks. Whereas performance requirements, e.g. in terms of speed, optical power or sensitivity, for such optical components may be relaxed as compared to their upper layer networks counterparts, cost efficiency and volume scalability in manufacturing are increasingly becoming the major requirements for their mass production Photonic integrated circuits (PICs), in which multiple elements of common or different functionalities are monolithically integrated onto one chip, are an attractive solution to mass production of highly functional optical components in that they enable scalable volume manufacturing by means of semiconductor wafer fabrication techniques. The PICs offer the ability to dramatically reduce the component footprint, avoid multiple packaging issues, eliminate multiple optical alignments and, eventually, create economical conditions in which optical components achieve the cost efficiency and volume scalability enabling to transfer them into consumer photonics products. The advantages of PIC technology become especially compelling when active waveguide devices, such as laser or photodetector, are combined with the passive waveguide circuitry to form a highly functional photonic system on the chip. Since the active devices usually all are made from artificially grown semiconductors having bandgap structure adjusted to the function and wavelength range of their particular application, such semiconductors are the natural choice for the base material of the PICs. For example, indium phosphide (InP) and related III-V semiconductors are the common material system for the PICs used in optical fiber communications, since they uniquely allow the active and passive devices operating in the most important wavelength windows around 1555 nm and 1310 nm to be combined onto the same InP substrate.

In the context of applications in the optical networks, PIC should be designed for operation in specific wavelength range(s), which are pre-determined, broadly, by physical properties of silica fibers (e.g. minimum loss in 1555 nm range and minimum dispersion in 1310 nm range), and, narrowly, by wavelength plan of a particular optical link (e.g. operating wavelengths sit on ITU wavelength grid within the fiber-limited ranges). With ever-increasing demand for higher capacity and flexibility of the optical networks, on one hand, and growing role of wavelength division multiplexing (WDM) and bandwidth provisioning as means to respond to those demands, on the other hand, the trend in wavelength requirements is clearly towards very narrow and well-controlled operating wavelength windows. The PIC design must be compliant with these requirements and yet should remain suitable for cost-efficient manufacturing with low complexity and high yield.

The well-known solution to wavelength-selective design of active (e.g. lasers and modulators) and passive (e.g. wavelength filters and elements of optical input/output) integrated photonics components is the use of periodic optical structures operating on the Bragg reflection principle and commonly referred to as waveguide Bragg gratings (WBGs). Physically, a waveguide Bragg grating is a one-dimensional periodic perturbation of propagation medium, which creates conditions for a wavelength-selective bi-directional coupling between waves propagating along the grating axis. From their functional properties point of view, Bragg gratings are almost ideally suited to applications in guided optics, which is that all the planar PICs are based upon, since they allow for wavelength-selective filtering, distributed Bragg reflection (DBR) and distributed feedback (DFB) in a course of waveguide propagation. Disregarding to the waveguide and WBG designs, periodic perturbation of the optical waveguide in the direction of propagation results in a bidirectional coupling in the wavelengths $$\lambda_m = (2n_{eff}/m)\Lambda, \ m=1,2,3 \qquad (1)$$

where $n_{eff}$ is the effective index of the optical waveguide mode and $\Lambda$ is the period of the grating. The coupling efficiency, however, does depend on the waveguide and WBG designs and, more specifically, is directly proportional to the overlap between the waveguide mode and the WBG. Therefore, from the WBG performance prospective, it is always advantageous to maximize this overlap by positioning the grating where the maximum optical field is positioned. On the other hand, this may be not necessarily the optimum solution from the fabrication complexity and yield points of view. A compromise between the performance and manufacturability should be based on a practical application need, such that if the PIC is a cost saving solution, the WBG has to perform adequately and yet be fabricated in a cost-efficient manner.

There are different techniques for processing the Bragg gratings in a context of a planar technology, but by far the most popular one is that, in which corrugated grating is defined by optical beam interference on a flat interface between the layers forming the waveguide core. For example, this technique is commonly used in a fabrication of high-performance DFB semiconductor lasers, since it enables the best overlap between the optical mode and the grating to be achieved to the advantage of the device threshold current, speed and other characteristics. However, it requires re-growth to complete the device fabrication and is very demanding as it concerns to the quality of the interface between the etched corrugated surface and newly grown epitaxial material, which injection current should pass through with minimal loss. Therefore, this technique is not a particularly low-complexity or high-yield solution.

An alternative approach, developed in the previous art precisely with a purpose to eliminate costly and low-yield re-growth processes form fabrication of the grating-based waveguide devices, DFB lasers in the first place, is related to so-called laterally coupled (LC) optical gratings. In this technique, historically proposed for, but not limited to the semiconductor ridge DFB lasers, the WBG is typically defined by holographic or electron beam or optical lithography on, or beside, or instead of the ridge waveguide sidewalls. In this way, the device fabrication can be completed by using only one growth step, which indeed is a significant and very attractive advantage from the manufacturing yield and cost points of view, but the overlap between the waveguide mode and the optical grating is not particularly strong since the latter is positioned at periphery of the former and the mode interacts with the grating only though its evanescent field.

The most elegant and fabrication-friendly solution for LC grating design known from the previous art and hereafter referred to as the effective-ridge laterally coupled surface etched grating (LC-SEG), is that in which the lateral optical confinement of the ridge waveguide is provided by and combined with the optical Bragg grating formed by two sets of narrow trenches etched from the top surface of the ridge, along the propagation direction and at a certain distance from one to the other.

An early example of such a design is described in the paper by L. M. Miller et al, "A Distributed Feedback Ridge Waveguide Quantum Well Heterostructure Laser", *Technology Lett.*, Vol. 3, No 1, PP. 6-8, 1991. The authors, by using direct e-beam lithography and reactive ion etching (RIE), were able to fabricate third- and fifth-order DFB lasers in InGaAs—GaAs—AlGaAs material system, operating in ~1050 nm wavelength, and be the first to demonstrate the effective-ridge LC-SEG design in work.

Later on, similar effective-ridge LC-SEG technique has been extended towards the GaInAsP—InP (e.g. H. Abe et al, "1.55 mm Surface Grating Strained MQW-DFB Laser", Ext. Abstr., 58$^{th}$ *Annual Meet. Jpn. Soc. Applied Physics*, P. 1111, 1997) and AlGaInAs—InP (e.g. J. Wang et al, "1.55-μm AlGaInAs—InP Laterally Coupled Distributed Feedback Laser", *IEEE Photon. Technology Lett.*, No 7, PP. 1372-1374, 2005) material systems. Longer wavelength second- and third-order DFB lasers operating in 1550 nm wavelength range have been fabricated by using holographic lithography and RIE or/and inductively-coupled plasma (ICP) etching, without re-growth steps.

Another example of the previous art, based on a similar design idea, is given in the paper by B. Reid et al, "Narrow Linewidth and High Power Distributed Feedback Lasers Fabricated without a Regrowth Step", *Proc. of European Conference on Optical Communications* 2003 (ECOC 2003), Rimini, 2003. In this paper, the third-order DFB lasers operating in 1470 nm-1490 nm wavelength range were fabricated in GaInAsP—InP material system, by using commercial optical stepper lithography and ICP etch process. In this particular previous art, lateral dimension of the grating was limited to only a couple of micrometers (exact number not reported by the authors), such that in fact the device combined the effective-ridge and corrugated ridge designs.

The last usually is used to term a different version of LC grating design, in which the lateral optical confinement is provided by a conventional ridge waveguide structure, where, however, the side walls (vertical or tilted) of the ridge are processed to form a corrugated surface (e.g. Y. Watanabe et al, "Laterally Coupled Strained MQW Ridge Waveguide Distributed-Feedback Laser Diode Fabricated by Wet-Dry Hybrid Etching Process", *IEEE Photon. Technology Lett.*, Vol. 10, No 12, PP. 1688-1690, 1998; Watanabe, U.S. Pat. No. 6,714,571 B2). The LC corrugated gratings are more complex to fabricate and, after all, not directly related to the present invention, which is limited to the LC-SEG designs.

From the teachings of the previous art, it is clear that the effective-ridge LC-SEG indeed is a highly manufacturable technique, implementable in one growth step, by using different means of lithography and methods of etching, proven on a wide range of materials. On the flip side, because of the very nature of the LC-SEG, which interacts with the optical waveguide mode only through its evanescent field, the devices based on this grating design suffer from the lack of coupling efficiency that limits their practical utilization. For example, in the case of DFB lasers, the weaker coupling results in a higher radiative loss or/and longer cavity length, which, eventually, increases the threshold current or/and reduced the modulation speed. It would be advantageous therefore to provide a solution removing the constraints of the prior art, by offering the design that enhances the coupling efficiency of the LC-SEG while preserving the low-complexity and high-yield fabrication advantages associated with this design concept.

OBJECT OF THE INVENTION

The object of the present invention is to provide a solution to the coupling enhancement in the effective-ridge LC-SEG waveguide structures. The objective is achieved by replacing the waveguide structure having one effective ridge, formed by the periodic continuous trenches, with the structure having a plurality of the effective ridges, formed by periodic segmented trenches, which reshapes the guided modes towards the higher overlap of the mode's optical field with the grating and, eventually, enhances the coupling for the effective-ridge LC-SEG waveguide.

It is a further object of the invention to enhance the coupling efficiency in the effective-ridge LC-SEG waveguide structures, such that the two sets of the parallel segmented trenches forming the multi-ridge optical waveguide can be different in their geometrical characteristics, e.g. have different periods, independently coupled to the optical signals propagating therein, and yet provide sufficient coupling for applications. This facilitates one-waveguide two-grating designs, in which the effective-ridge LC-SEG waveguide structure has more functional options than the ordinary grating one. In particular, if the gratings on both sides of the main ridge have different periods, such effective-ridge LC-SEG waveguide will demonstrate the wavelength-selective features in two different wavelengths.

SUMMARY OF THE INVENTION

In accordance with the invention, there is an optical structure composed from layers of the optical materials defined by their refractive indices and arranged to provide a vertical confinement to the optical signals propagating in the plane of the layers, such that resulting slab waveguide supports only one guided optical mode in any wavelength within a predetermined operating wavelength range;

whereas, two periodic sequences of parallel segmented trenches are defined by direct writing e-beam or optical stepper lithography or any other suitable method and etched from the top surface of the structure, at a certain short distance from each other, therefore leaving a strip of intact material in between, hereafter referred to as the central effective ridge;

therein, the segmented trenches have the segments of the intact material at a certain short distance from the central effective ridge, such that they form additional effective ridges on either side of the central ridge, hereafter referred to as the side effective ridges;

therefore, the central and side effective ridges created by two parallel sets of periodic segmented trenches provide a diluted lateral guiding to the vertically-confined slab waveguide mode, caused by the refractive index differences between the etched and intact parts of the structure;

therein, vertically- and laterally-confined optical mode propagating along the effective ridges and in a direction perpendicular to the segmented trenches, interacts with the WBG formed by these trenches, the efficiency of interaction being characterized by the coupling coefficient, which is roughly proportional to the overlap between the two-dimensional mode's optical field and the grating;

whereas, the invention discloses the designs of the LC-SEG waveguide structure, based on the segmented trenches and a plurality of the effective ridges formed by these trenches, which dilutes the lateral guiding and, in this way, increases the overlap of the two-dimensional mode's optical field with the WBG, therefore, enhancing the coupling efficiency for the LC-SEG waveguide structure.

In the other aspect of the invention, coupling-enhanced LC-SEG waveguide structure has the segmented trenches on both sides of the central effective ridge, which are different in some of their geometrical characteristics and yet, together, form a diluted lateral waveguide, which supports only one guided optical mode in any wavelength within a pre-determined wavelength range. Then, in accordance with the invention, such coupling-enhanced LC-SEG waveguide structure allows for the optical mode propagating therein to efficiently interact with two different optical Bragg gratings, therefore increasing the functionality of the wavelength-selective device.

In a first embodiment of the invention, the coupling-enhanced LC-SEG waveguide structure design is applied to a semiconductor DFB laser. The said laser consists of a lightly or unintentionally doped separate confinement heterostructure (SCH), including an active region having effective bandgap energy adjusted to the laser's operating wavelength range, sandwiched between heavily doped cladding/contact layers and grown in one epitaxial growth step on a semiconductor substrate; coupling-enhanced LC-SEG etched in said cladding/top contact layer(s) above the SCH layers, effectively shaping a multi-ridge diluted lateral waveguide structure. The contacts are formed atop the central ridge and either at the bottom of the heavily-doped substrate (bottom contact layout) or atop the heavily-doped lower contact layer grown on semi-insulating substrate, aside from the multi-ridge waveguide structure (side contact layout). The said DFB laser implemented in a side contact layout is a building block for PICs in III-V semiconductor materials, such as InP and related materials.

In a second embodiment of the invention, left and right sides of the coupling-enhanced LC-SEG are shifted along the waveguide by a portion of a period to ensure single longitudinal mode generation in said DFB lasers, by providing a complex coupling coefficient.

In a third embodiment of the invention, the left and right sides of the coupling-enhanced LC-SEG are implemented with two slightly different periods, thereby realizing a two-wavelength DFB laser. The coupling enhancement of the present invention is essential for practical implementation due to effective halving of coupling efficiency within the implemented grating.

In the fourth embodiment of the invention, the coupling-enhanced LC-SEG waveguide structure design is applied to a semiconductor DBR laser. The device has the layer structure similar to that described above for the DFB laser, but differs in that it concerns to the mechanism of the optical feedback. This is provided by wavelength-selective DBR mirrors, which are positioned on both sides of the gain region, such that this region and both DBR mirrors are parts of a common guiding structure. The said guiding structure consists of a conventional shallow etched ridge waveguide (hereafter term "shallow etch ridge waveguide" means that the ridge is formed within the slab waveguide cladding and etching does not reach the slab waveguide core, whereas the term "deep etch ridge waveguide" refers to the design in which the slab waveguide core is a part of the ridge and hence etching goes through the core) and two effective ridges formed by the coupling-enhanced gratings etched in the upper cladding/contact layer(s) of the laser structure.

The designs of both the conventional ridge waveguide in the middle and two effective-ridge waveguides at the edges of the structure are adjusted to provide the optical impedance matching between the conventional and effective-ridge waveguides and, therefore, reduce reflection from the junctions between them. The contacts are formed atop the middle conventional ridge and either at the bottom of the heavily-doped substrate (bottom contact layout) or atop the heavily-doped lower contact layer grown on semi-insulating substrate, aside from and along with the conventional ridge part of the guiding structure (side contact layout). The said DBR laser implemented in a side contact layout is a building block for PICs in III-V semiconductor materials, such as InP and related materials.

In the fifth embodiment of the invention, the coupling-enhanced LC-SEG waveguide structure is applied to a passive semiconductor waveguide to provide a wavelength filter. Passive waveguide consisting of a core layer(s) with higher refractive index, sandwiched between cladding layers having lower refractive index, such that, in use, the resulting slab waveguide supports only one guided optical mode in any wavelength within a predetermined operating wavelength range. In a longitudinal direction, i.e. in a direction of propagation, the said wavelength filter is composed from an effective-ridge LC-SEG waveguide, where segmented trench SEG is etched in the upper cladding of the slab waveguide structure, sandwiched between two conventional shallow etch ridge waveguides. The layer structure and layout designs of this three-section waveguide are adjusted to provide the optical impedance matching between the conventional and effective-ridge waveguides in any wavelength within a predetermined range of operating wavelengths, such that reflection from the junctions between the waveguide sections is minimized to negligible. Said waveguide wavelength filter provides building blocks for PICs, either as a reflective passband filter or as a transmissive notch filter.

In a sixth embodiment of the invention, the left and right sides of the coupling-enhanced LC-SEG are implemented with two slightly different periods, thereby realizing a two-wavelength filter. The coupling enhancement of the present invention is essential for practical implementation due to effective halving of coupling efficiency within the implemented grating.

It would be evident to one skilled in the art that other embodiments may be considered without departing from the present invention to provide DFB or DBR waveguide structures, within different functional elements of the PICs. It would also be evident that extension of the present invention to different material systems is possible.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
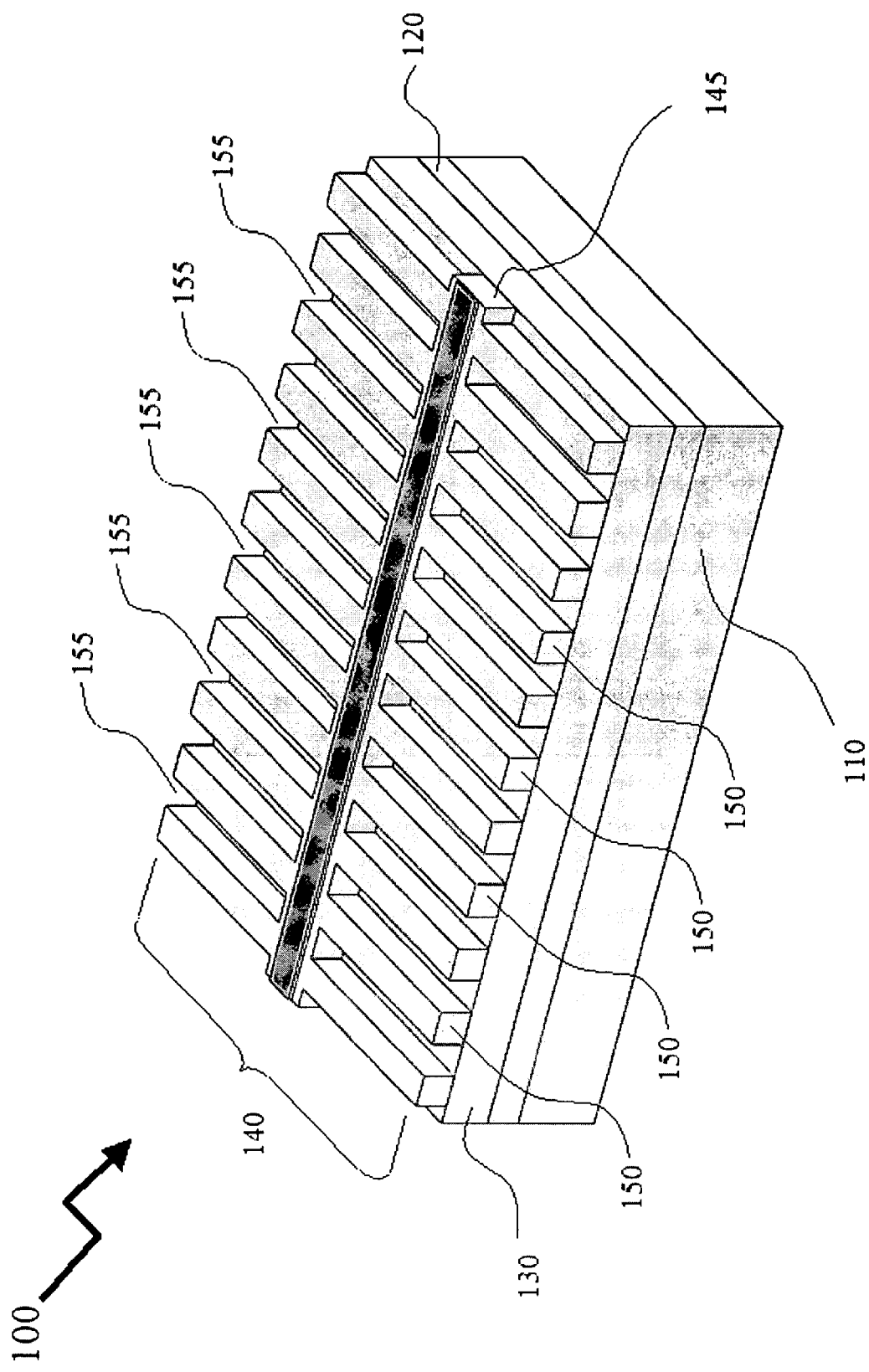
FIG. 1 presents a schematic three-dimensional view of a prior art embodiment of an ordinary single effective-ridge LC-SEG waveguide structure using periodic continuous trenches to form the WBG.

FIG. 1 illustrates a schematic three-dimensional view of a prior art embodiment of an effective-ridge LC-SEG structure 100. Shown are a waveguide layer structure comprising lower cladding layer 110, core waveguiding layer 120, and upper cladding layers 130 and 140. The LC-SEG waveguide structure is defined by the parallel continues trenches etched in the top portion of the upper cladding layer 140 on the both sides of the narrow strip of the intact material 145, which acts as the (only) effective ridge providing the lateral confinement to the slab waveguide modes propagating in the direction perpendicular to the trenches. This is caused by the difference in refractive indices between the intact and etched parts of the LC-SEG, 150 and 155, respectively, in which the former always has the higher refractive index than the latter for any wavelength within a certain predetermined range of the operating wavelengths. Periodicity of the trenches results in a periodical perturbation of the effective-ridge waveguide, Bragg reflection and, eventually, bidirectional coupling of the guided modes propagating therein and interacting with the LC-SEG.

The coupling coefficient $\kappa_m$ of the m-th order LC-SEG operating in wavelength $\lambda_m$ can be estimated (e.g. see G. P. Agrawal and N. K. Dutta, "Longwavelength Semiconductor Lasers", N. Y. Van Nostrand, 1968) as:

$$\kappa_m \approx \frac{\sin(\pi m \xi_E)}{m} \frac{n_I^2(\lambda_m) - n_E^2(\lambda_m)}{\lambda_m n_{\mathit{eff}}(\lambda_m)} \Gamma(\lambda_m), \quad (2)$$

where $\xi_E$ is the etching duty cycle in the periodic trench structure, i.e. the fraction of the grating period occupied by the trench; $n_E$ and $n_I$ are the wavelength-dependent material refractive indices inside and outside the trenches, respectively, and $\Gamma$ is the overlap integral between the mode's field and the grating. As it is seen from (2), on one hand, the coupling efficiency is directly proportional to the refractive index contrast between the etched 155 and intact 150 parts of the top portion of the upper cladding, whereas, on the other hand, it is proportional to the overlap integral $\Gamma$. The last drops sharply (almost exponentially) with the increase of the difference between the mode's effective index and effective material index of the grating, $n_G$, estimated as $$n_{G,P} = \sqrt{\xi_E n_E^2 + (1-\xi_E) n_I^2}, \text{ and}$$

$$n_{G,\perp} = 1/\sqrt{\xi_E / n_E^2 + (1-\xi_E)/n_I^2},$$

for TE and TM polarizations, respectively, which suggests that LC-SEG waveguide structures with relatively low index contrast between etched and intact parts of the grating have an advantage in terms of their coupling efficiency.

However, in many practical cases and particularly in the effective-ridge LC-SEG waveguide structures made from III-V semiconductor materials, as it was the case in all previous art known to the authors, typical values of the refractive index in the cladding layers, $n_I$, are well above 3, whereas disregarding to dielectric material used to fill in the etched parts 155, if any at all, its refractive index, $n_E$ does not exceed 2. This is indeed a very high index contrast resulting in a sharp drop of the mode's filed away from the effective ridge for any reasonable etching duty cycle $\xi_E$ and, therefore, relatively low overlap between this filed and the LC-SEG.

The limitations of the prior art may be relaxed and the coupling efficiency of the effective ridge LC-SEG structure improved by diluting the lateral guiding. Such dilution resulting in the optical waveguide mode's optical field penetrating further into the grating, thereby improving the optical field overlap with it. One possible solution, which the present invention is based upon and which is particularly important for the semiconductor and other high index contrast LC-SEG structures, is a replacing of the continuous periodic trenches with the segmented periodic trenches and, in this way, creating an effective ridge waveguide structure having not one but a plurality of the effective ridges with a significant optical field between them.

Figure 2:
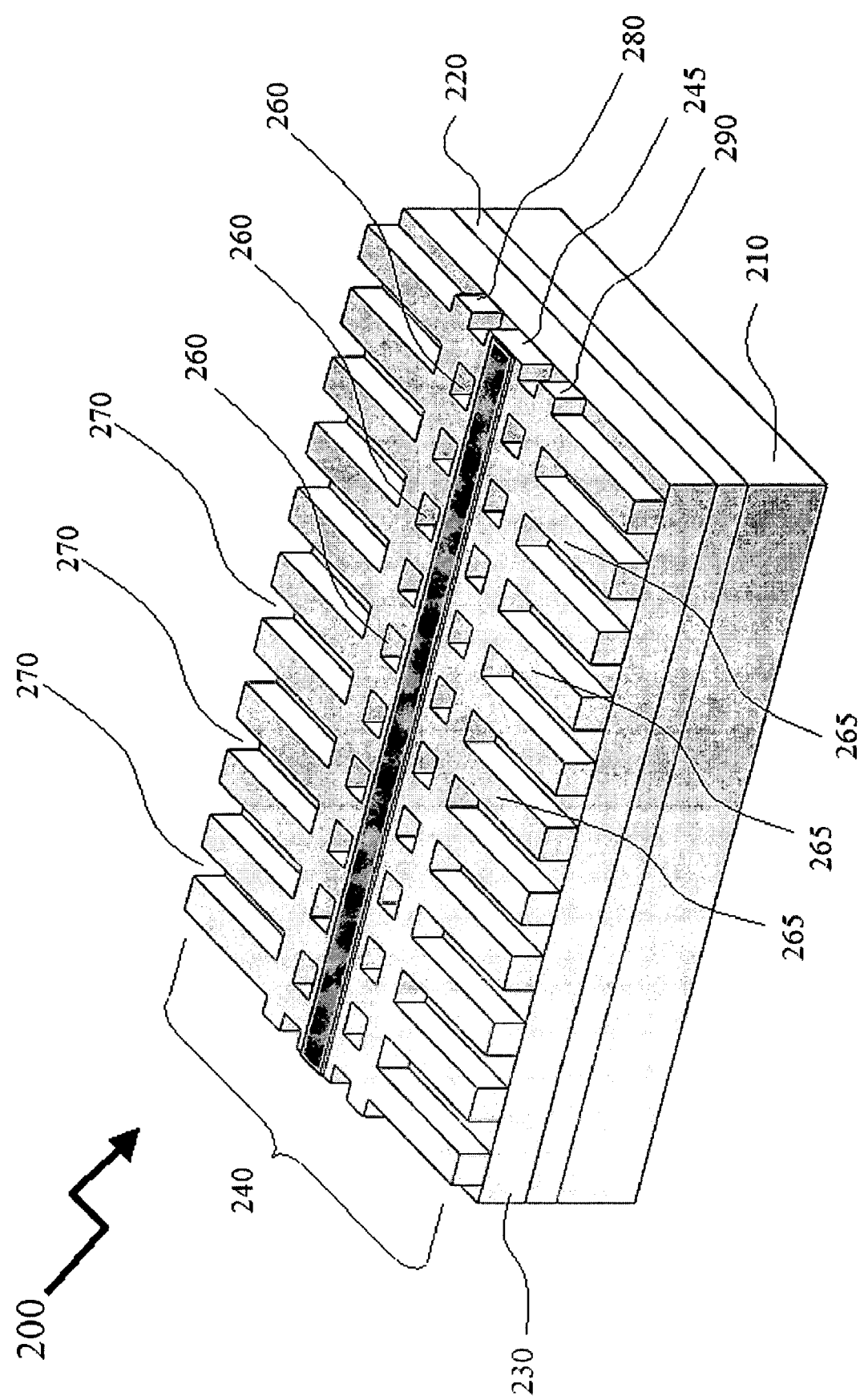
FIG. 2 illustrates an isometric view of the LC-SEG part of the waveguide structure related to the first, fourth and fifth embodiments of the invention, wherein two sets of symmetric (with respect to propagation axis) periodic segmented trenches form the central and two side ridges to provide the enhanced coupling in the effective-ridge LC-SEG waveguide structure.

FIG. 2 illustrates an exemplary embodiment of the effective-ridge LC-SEG formed by periodic segmented trenches, which has 3 effective ridges, the central effective ridge and two symmetric side effective ridges. The waveguide layer structure is similar to that shown in FIG. 1 and comprises lower cladding layer 210, core waveguiding layer 220, and upper cladding layers 230 and 240. The LC-SEG waveguide structure is defined by the parallel segmented trenches etched in the top portion of the upper cladding layer 240 on the both sides of the narrow strip of the intact material 245, which acts as the central effective ridge, and the side effective ridges 280 and 290. The role of the side effective ridges is in that they sack the decaying evanescent field and in this way strengthen it in the space between the central and side effective ridges occupied by the WBG, therefore increasing the mode's field overlap with the grating. Similar design principle can be extended to the structures with higher number of the effective ridges, e.g. 5 or 7.

Figure 3:
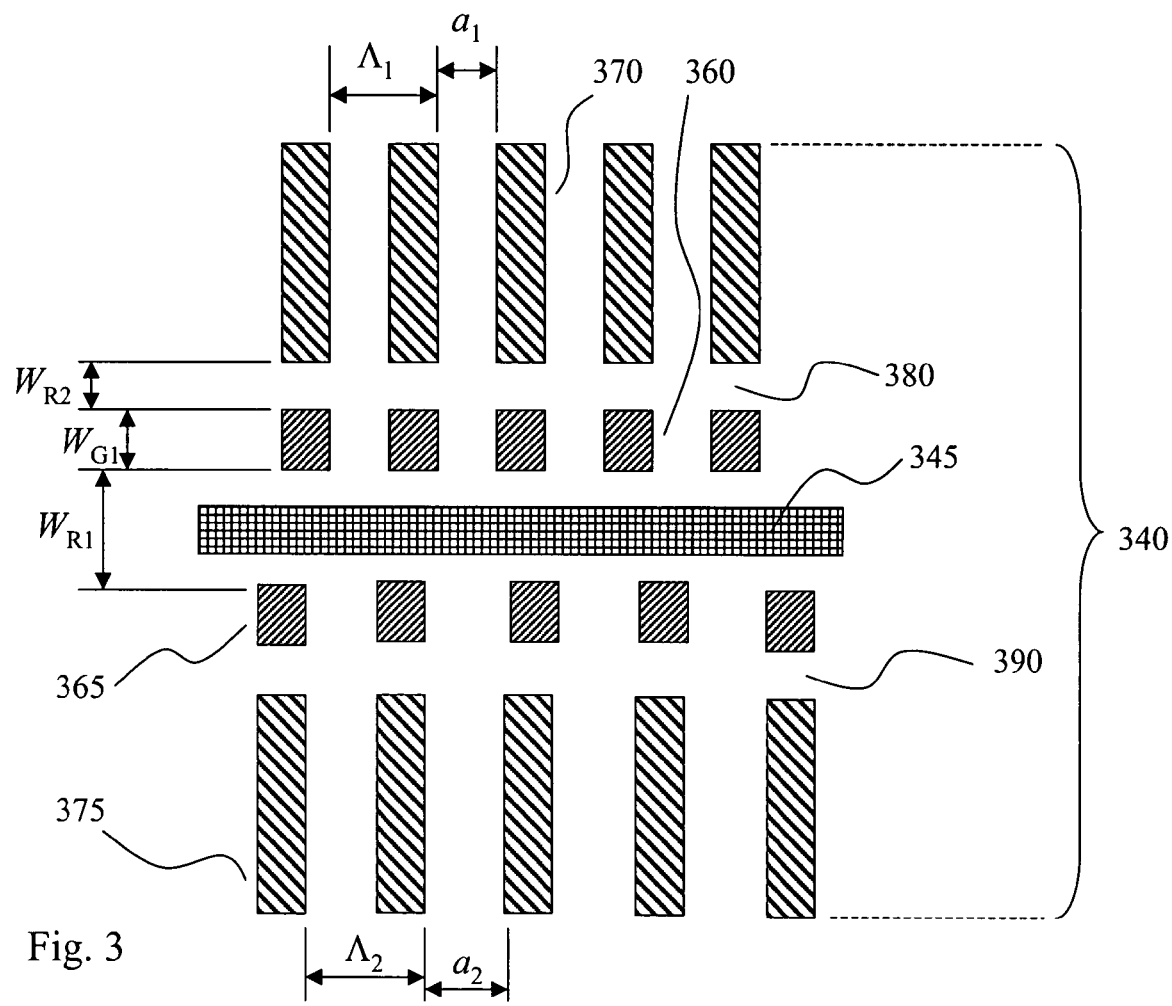
FIG. 3 illustrates a plan view of the LC-SEG part of the waveguide structure related to the second, third and sixth embodiments of the invention, wherein the surface etched grating design on either side of the central ridge waveguide is different.

Coupling enhancement due to the lateral mode reshaping achieved through utilization of the segmented periodic trenches and multiple effective ridge designs of the LC-SEG waveguide structure greatly depends on the grating layout features, relevant to the slab waveguide design and operating wavelength. FIG. 3 illustrates a top plan view of the coupling-enhanced grating forming a three-ridge waveguide structure described above. Most critical grating layout parameters are the widths of the effective ridges, $W_{R1}$ and $W_{R2}$, and the space between them occupied by the grating, $W_{G1}$. Variation of these, as well as the number of the effective ridges, may be a powerful design tool in optimization of the effective-ridge LC-SEG waveguide structures.

Figure 4:
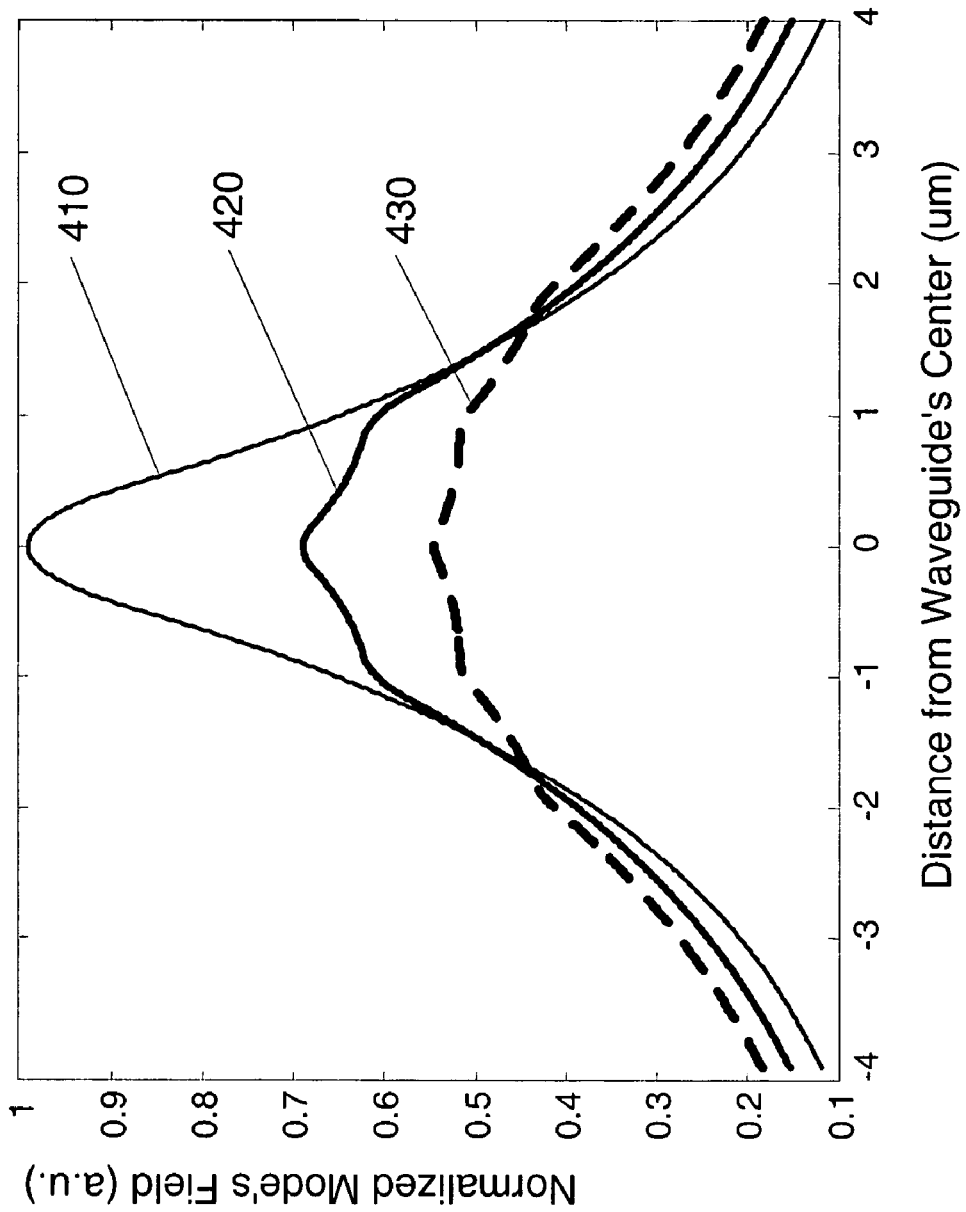
FIG. 4 illustrates the mode's field profiles (in the lateral direction) for the effective-ridge LC-SEG waveguide structures based on the same exemplary slab waveguide but having different segmented trenches designs.

FIG. 4 illustrates the effect of the grating layout on the shape of the fundamental lateral waveguide mode and coupling efficiency in the effective-ridge LC-SEG waveguide structure. Shown in this figure is the lateral distribution of the optical mode's filed in a number of the structures having the same slab waveguide but different periodic trench grating layout. The results are obtained by numerical simulations based on a simple exemplary layer structure in GaInAsP—InP material system, operating at room temperature in 1555 nm wavelength, which is detailed below.

TABLE I

EXEMPLARY LAYER STRUCTURE USED IN SIMULATIONS PRESENTED IN FIG. 4

| Layer | Material | Refractive Index | Thickness (μm) |
|---|---|---|---|
| Upper Cladding II | InP | 3.168831 | 0.900 |
| Etch Stop | GaInAsP ($\lambda_g$ = 1300 nm) | N/A | 0.005 |
| Upper Cladding I | InP | 3.168831 | 0.100 |
| Guiding Core | GaInAsP ($\lambda_g$ = 1000 nm) | 3.224153 | 0.600 |
| Lower Cladding | InP | 3.168831 | 1.000 |
| Substrate | InP | 3.168831 | N/A |

Each semiconductor layer within this layer stack has its bandgap wavelength, $\lambda_g$, well below the operating wavelength $\lambda$=1555 nm and, therefore, is transparent in this wavelength. As grown, this layer structure forms a passive slab waveguide, which supports only one vertically confined optical mode in the operating wavelength in any polarization of light. The first-order LC-SEG with the optimum etching duty cycle of $\xi_E$=0.5 is defined in the top portion of the upper cladding layer and has the trenches of 0.7 μm depth and $\xi_E\Lambda=(\xi_E m\lambda)/(2n_{eff})\approx 0.122$ μm width, filled with $Si_xN$ ($n_E\approx 2.0$). The modeled configurations of the LC-SEG waveguide structure based on the slab waveguide and grating pitch described above have 1, 3 and 5 effective ridges, formed by segments of the intact material in a periodic sequence of segmented trenches.

The key layout and performance features (limited to the fundamental lateral mode) of the effective-ridge LC-SEG waveguide structures used in the simulations are summarized in the Table II below. In the operating wavelength of $\lambda$=1555 nm, each of them supports only one laterally and vertically confined optical mode in any polarization.

TABLE II

KEY LAYOUT AND PERFORMANCE FEATURES OF EXEMPLARY LC-SEG WAVEGUIDE STRUCTURE USED IN SIMULATIONS PRESENTED IN FIG. 4

| Number of Effective Ridges | Width of Effective Rides | Gap Between Effective Ridges | TE Mode's Overlap Integral with SEG | TE Mode's Coupling Coefficient |
|---|---|---|---|---|
| 1 | 1.000 μm | N/A | 0.00042 | 5.2 cm$^{-1}$ |
| 3 | 0.333 μm | 0.666 μm | 0.0037 | 44.9 cm$^{-1}$ |
| 5 | 0.200 μm | 0.750 μm | 0.0048 | 58.1 cm$^{-1}$ |

From the data presented in FIG. 4, it is clearly seen that replacing a single effective ridge with multiple effective ridges having the same combined width indeed dilutes the lateral confinement and expands the optical field into the etched grating areas between the effective ridges. This increases the overlap integral between the mode's field and the grating, resulting in an enhancement of the coupling efficiency of the LC-SEG waveguide structure. The achievable scale of the coupling enhancement is evident from the data presented in the Table II, which indicates that more than 10-fold enhancement of the mode's coupling with the grating, up to the respectable ~60 cm$^{-1}$, is possible by using the proposed technique.

An ability of the coupling-enhanced LC-SEG to have the coupling coefficient in the range of many tens of cm$^{-1}$ provides a way for a practical implementation of the other aspect of the present invention, in which the segmented trenches on both sides of the central ridge are different in some of their geometrical characteristics, such that one-waveguide two-grating LC-SEG designs are possible. An exemplary embodiment of this aspect of the invention is illustrated, schematically, by the top plan view of the coupling-enhanced grating forming a three-ridge waveguide structure, shown in FIG. 3. The etched portions 360 and 370 on the either side of the first side ridge 380 are on a first pitch $\Lambda_1$, and are spaced by a distance $\alpha_1$ along the first side ridge 380. These therefore define a first periodical perturbation of the effective ridge waveguide and result in a first grating for optical modes propagating within the structure with a first wavelength $\lambda_1$.

The etched portions 365 and 375 either side of the second side ridge 390 are on a first pitch $\Lambda_2$ and are spaced by a distance $\alpha_2$ along the second side ridge 390. These therefore define a second periodical perturbation of the effective ridge waveguide and result in a second gating for optical modes propagating within the structure with a second wavelength $\lambda_2$. For exemplary layer structure and multi-ridge LC-SEG waveguide layout having 5 effective ridges outlined in the Tables I and II, this one-waveguide two-wavelength solution enables wavelength filtering with the coupling efficiency of ~30 cm$^{-1}$ in each of two slightly different wavelengths $\lambda_1$ and $\lambda_2$ within 1555 nm wavelength range to be realized within a very compact passive waveguide arrangement.

It would be evident to those skilled in the art that similar design principle can be extended towards a higher number of the effective ridges than those described. Further, it would be understood by those skilled in the art that the above-described coupling enhancement mechanism in the effective ridge LC-SEG structures is not limited to the fundamental lateral mode and, to the contrary, is even more efficient in the case of higher order lateral modes as these have their lateral guiding more subjected to a dilution caused by a partitioning of the effective ridge.

Numerous other embodiments, which differ by the design of the effective ridge LC-SEG structure and choice of the operating waveguide mode, may be envisaged without departing from the spirit or scope of the invention.

What is claimed is:

1. A coupling arrangement for an effective-ridge lateral-coupling surface etched grating waveguide structure comprising:
   a multiple effective-ridge waveguide comprising:
      a slab waveguide structure comprising of a number of layers arranged to provide a vertical confinement for an optical signal having a wavelength within a predetermined operating wavelength range, propagating within the said structure in the direction parallel to the layers;

a central ridge waveguide; the central ridge waveguide consisting of a continuous strip of the slab waveguide structure; the central ridge waveguide providing a first aspect of horizontal confinement of the optical signal propagating within the slab waveguide;

at least a side ridge; the at least a side ridge consisting of a continuous strip of the slab waveguide structure and providing a second aspect of horizontal confinement of the optical signal propagating within the slab waveguide;

a surface-etched grating comprising:

a periodic sequence of parallel segmented trenches etched from the top surface of the slab waveguide structure, such that intact segments of the slab waveguide structure form strips of intact material providing a higher refractive index to the optical signal than that of sections of the slab waveguide structure with etched segments; wherein, the effective-ridge lateral-coupling surface etched grating waveguide supports at least one laterally and vertically confined mode of a plurality of modes at any wavelength within the predetermined operating wavelength range; and, the design of the multiple effective-ridge waveguide and surface-etched grating are adjusted to achieve an overlap exceeding a predetermined threshold between an optical mode field of a laterally and vertically confined mode of the plurality of modes of an optical signal propagating within the effective-ridge lateral-coupling surface etched grating waveguide and the surface-etched grating.

2. A coupling arrangement for an effective-ridge lateral-coupling surface etched grating waveguide structure as in claim 1 wherein;

the ridges are designed and patterned to provide an increase of the overlap as compared to a conventional single effective-ridge design which is absent the at least a side ridge for at least one of the fundamental mode and first lateral mode of the multiple effective-ridge waveguide.

3. A coupling arrangement for an effective-ridge lateral-coupling surface etched grating waveguide structure as in claim 1 wherein, the surface-etched grating comprises a distributed reflective grating for a first wavelength, the first wavelength being within the predetermined operating wavelength range.

4. A coupling for an effective-ridge lateral-coupling surface etched grating waveguide structure according to claim 1 wherein, the multiple effective-ridge waveguide comprises at least the central ridge waveguide and two side ridges, the two side ridges being formed on either side of the central ridge waveguide, and, the surface-etched grating is formed such that, the positions of the periodic sequence of parallel segmented trenches formed on the side of the central ridge are defined by a first predetermined location series; and the positions of the periodic sequence of parallel segmented trenches formed on the other side of the central ridge are defined by a second predetermined location series.

5. A coupling arrangement for an effective-ridge lateral-coupling surface etched grating waveguide structure according to claim 4 wherein, the first and second predetermined location series are at least one of identical, the same but shifted relative to each other by a portion of a period of the periodic pitch of the parallel segmented trenches such that, in use, a phase shift between the first and the second periodic segmented Wench series is created to destroy the longitudinal mode dual degeneracy in a resulting distributed feedback structure, and different such that the first and second predetermined location series of parallel segmented trenches form first and second optical gratings for bidirectional coupling of optical signals in each of a first and second wavelength range respectively.

6. A coupling arrangement for an effective-ridge lateral-coupling surface etched grating waveguide structure according to claim 5, wherein the first and second predetermined location series of parallel segmented trenches form at least one of a bidirectional optical grating for bidirectional coupling of optical signals in a predetermined wavelength range, a distributed reflective surface-etched grating forming part of a semiconductor laser structure providing at least one of a distributed feedback (DFB) laser and a distributed Bragg reflector (DBR) laser, a distributed reflective surface-etched grating forming part of a wavelength filter, and distributed reflective surface-etched gratings forming part of a two wavelength filter.

7. A coupling for an effective-ridge lateral-coupling surface etched grating waveguide structure according to claim 1 wherein, the multiple effective-ridge waveguide comprises at least the central ridge waveguide and two side ridges, the two side ridges being formed on either side of the central ridge waveguide, and, the surface-etched grating is formed such that, the positions of the periodic sequence of parallel segmented trenches formed between the central ridge and the side is defined by a third predetermined location series; and the positions of the periodic sequence of parallel segmented trenches formed on the outside of side ridge is defined by a fourth predetermined location series.

8. A coupling arrangement for an effective-ridge lateral-coupling surface etched grating waveguide structure according to claim 7, wherein the third and fourth predetermined location series of parallel segmented trenches form at least one of distributed reflective surface-etched gratings forming part of a two wavelength filter, third and fourth optical gratings respectively for bidirectional coupling of optical signals in third and fourth wavelength ranges respectively, and third and fourth distributed reflective surface-etched gratings forming part of a semiconductor laser structure operating as at least one of a distributed feedback (DFB) laser and a distributed Bragg reflector (DBR) laser.

9. A coupling arrangement for a distributed reflective grating according to claim 1 wherein;

the multiple effective-ridge waveguide and surface-etched grating are formed as part of the same semiconductor integrated circuit.

10. A coupling arrangement for a distributed reflective grating according to claim 9 wherein;

the semiconductor integrated circuit is provided upon a substrate, the substrate being at least one of gallium arsenide and indium phosphide.

11. A coupling arrangement for a distributed reflective grating according to claim 1 wherein;

the multiple effective-ridge waveguide and surface-etched grating are provided within at least one of the same layer of the slab waveguide structure, a same layer and at least an additional layer of the slab waveguide structure, different layers of the slab waveguide structure, and a layer of the slab waveguide structure with an addition of extra material for one of the multiple effective-ridge waveguide or surface-etched grating.

12. A method comprising:
propagating an optical signal within a predetermined operating wavelength range within a multiple effective-ridge waveguide having at least one laterally and vertically confined mode of a plurality of modes at any wavelength within the predetermined operating wavelength range, the multiple effective-ridge waveguide comprising;
- a slab waveguide structure comprising of a number of layers arranged to provide a vertical confinement for an optical signal having a wavelength within a predetermined operating wavelength range, propagating within the said structure in the direction parallel to the layers;
- a central ridge waveguide; the central ridge waveguide consisting of a continuous strip of the slab waveguide structure; the central ridge waveguide providing a first aspect of horizontal confinement of the optical signal propagating within the slab waveguide;
- at least a side ridge; the at least a side ridge consisting of a continuous strip of the slab waveguide structure and providing a second aspect of horizontal confinement of the optical signal propagating within the slab waveguide;

providing a surface-etched grating, the surface-etched grating comprising;
- a periodic sequence of parallel segmented trenches etched from the top surface of the slab waveguide structure, such that intact segments of the slab waveguide structure form strips of intact material providing a higher refractive index to the optical signal than that of sections of the slab waveguide structure with etched segments; wherein, the overlap between the at least one optical mode field of a laterally and vertically confined mode of the plurality of modes of the optical signal propagating within the resulting effective ridge lateral-coupling surface etched grating waveguide and the surface-etched grating exceeds a predetermined value.

13. A method of claim 12 wherein;
providing the predetermined threshold is higher than the coupling efficiency of a conventional single effective-ridge design which is absent the at least a side ridge for at least one of the fundamental mode and first order lateral mode of the multiple effective-ridge waveguide.

14. A method according to claim 12 wherein,
providing the surface-etched grating comprises providing a distributed reflective grating for a first wavelength, the first wavelength being within the predetermined operating wavelength range.

15. A method according to claim 12 wherein,
providing the multiple effective-ridge waveguide comprises providing at least the central ridge waveguide and two side ridges, the two side ridges being formed on either side of the central ridge waveguide, and,
providing the surface-etched grating is achieved by providing at least a periodic sequence of parallel segmented trenches, such that, the positions of the periodic sequence of parallel segmented trenches formed on one side of the central ridge are defined by a first predetermined location series; and
the positions of the periodic sequence of parallel segmented trenches formed on the other side of the central ridge are defined by a second predetermined location series.

16. A method according to claim 15 wherein,
providing the first and second predetermined location series comprises providing first and second predetermined location series that are at least one of identical, the same but shifted relative to each other by a portion of a period of the periodic pitch of the parallel segmented trenches such that, in use, a phase shift between the first and the second periodic segmented trench series is created to destroy the longitudinal mode dual degeneracy in the resulting distributed feedback cavity, and different such that the first and second predetermined location series of parallel segmented trenches form first and second optical gratings for bidirectional coupling of optical signals in each of a first and second wavelength range respectively.

17. A method according to claim 16, wherein
providing the first and second predetermined location series of parallel segmented trenches comprises forming at least one of a bidirectional optical grating for bidirectional coupling of optical signals in a predetermined wavelength range, a distributed reflective surface-etched grating forming part of a semiconductor laser structure providing at least one of a distributed feedback (DFB) laser and a distributed Bragg reflector (DBR) laser, a distributed reflective surface-etched grating forming part of a wavelength filter, and distributed reflective surface-etched gratings forming part of a two wavelength filter.

18. A method according to claim 12 wherein,
providing the multiple effective-ridge waveguide comprises providing at least the central ridge waveguide and two side ridges, the two side ridges being formed on either side of the central ridge waveguide, and,
providing the surface-etched grating is such that, the positions of the periodic sequence of parallel segmented trenches formed between the central ridge and each of the side ridges are defined by a third predetermined location series; and
the positions of the periodic sequence of parallel segmented trenches formed on the outside of each of the side ridges are defined by a fourth predetermined location series.

19. A method according to claim 18, wherein
providing the third and fourth predetermined location series of parallel segmented trenches comprises forming at least one of distributed reflective surface-etched gratings forming part of a two wavelength filter, third and fourth optical gratings respectively for bidirectional coupling of optical signals in third and fourth wavelength ranges respectively, and third and fourth distributed reflective surface-etched gratings forming part of a semiconductor laser structure operating as at least one of a distributed feedback (DFB) laser and a distributed Bragg reflector (DBR) laser.

20. A method according to claim 12 wherein,
providing the multiple effective-ridge waveguide and surface-etched grating comprises providing a semiconductor integrated circuit.

21. A method according to claim 20 wherein,
providing the semiconductor integrated circuit comprises providing a second plurality of layers upon a substrate, the substrate being at least one of gallium arsenide and indium phosphide.

22. A method according to claim 12 wherein,
providing the multiple effective-ridge waveguide and surface-etched grating comprises providing them within at least one of the same layer of the slab waveguide structure, a same layer and at least an additional layer of the slab waveguide structure, different layers of the slab waveguide structure, and a layer of the slab waveguide structure with an addition of extra material for one of the multiple effective-ridge waveguide or surface-etched grating.

* * * * *